(12) United States Patent
Bayot et al.

(10) Patent No.: US 6,455,350 B1
(45) Date of Patent: Sep. 24, 2002

(54) METHODS AND APPARATUS FOR MANUFACTURING BALL GRID ARRAY SEMICONDUCTOR DEVICE PACKAGES

(75) Inventors: Arthur Allan Bayot; Ferdinand B. Arabe, both of Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/963,479

(22) Filed: Sep. 27, 2001

(51) Int. Cl.[7] .................. H01L 21/44; H01L 21/48; H01L 21/50
(52) U.S. Cl. ......................... 438/106; 438/612
(58) Field of Search .............. 438/26, 51, 55, 438/64, 106, 108, 118, 125, 612

(56) References Cited

U.S. PATENT DOCUMENTS 5,992,729 A * 11/1999 Koopman et al. .......... 228/175

* cited by examiner

*Primary Examiner*—David Nelms
*Assistant Examiner*—David Nhu
(74) *Attorney, Agent, or Firm*—Michael K. Skrehot; W. James Brady, III; Frederick J. Telecky, Jr.

(57) ABSTRACT

A method of manufacturing a ball grid array semiconductor package includes the step of providing a substrate (103) having a first surface (103b) and a second surface (103a), in which the first surface (103b) or the second surface (103a) include a conductor pattern (104). The method also includes the step of disposing a plurality of conductive bumps (107) on the first surface (103b) of the substrate (103) and attaching a semiconductor die (102) to the second surface (103a) of the substrate (103). The method further includes the step of electrically connecting the conductive bumps (107) to the conductor pattern (104), such that electrically connecting the conductive bumps (107) to the conductor pattern (104) mechanically affixes the conductive bumps (107) to the first surface (103b) of the substrate (103). The method also includes the steps of mechanically testing the ball grid array semiconductor package (100) to determine whether a height of the conductive bumps (107) are substantially uniform, and planarizing the conductive bumps (107) when the height of the conductive bumps are non-uniform.

11 Claims, 3 Drawing Sheets

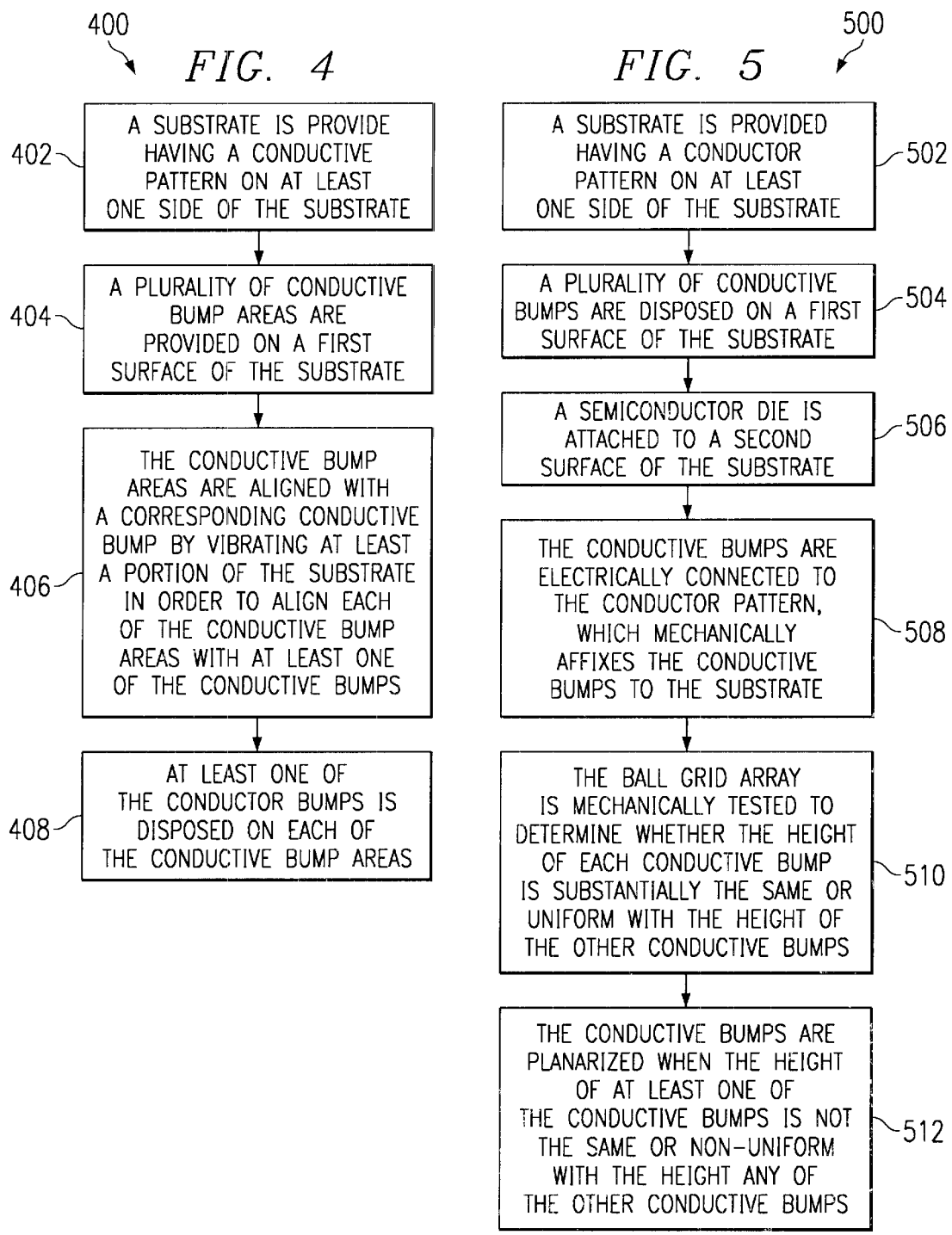

METHODS AND APPARATUS FOR MANUFACTURING BALL GRID ARRAY SEMICONDUCTOR DEVICE PACKAGES

BACKGROUND OF THE INVENTION

1. Field of the Invention

The present invention relates generally to the field of semiconductor device packaging. More specifically, the invention relates to methods of manufacturing ball grid array semiconductor packages for the packaging of semiconductor devices.

2. Description of Related Art

Some known methods of packaging semiconductor devices, such as semiconductor dies, integrated circuit chips, and the like, may include dual in-line packaging, pin grid array packaging, tape carrier packaging, and quad flat packaging. Nevertheless, as a pin count of a semiconductor device increases, the complexity of manufacturing semiconductor device packages using these known methods also may increase. Employing ball grid arrays semiconductor packages in order to package semiconductor devices may reduce the complexity of manufacturing semiconductor device packages because the ball grid array may serve as an electrical contact between the semiconductor package and an external component, such as a motherboard of a computer. Some known ball grid array packaging methods may include etching a conductor pattern onto either a first surface or a second surface of a substrate, and providing a plurality of conductive bump contact areas on the first surface of the substrate. With these known methods, a conductive bump, such as a semi-spherical or a substantial spherical solder bump, subsequently may be disposed on each of the conductive bump contact areas, and a semiconductor die may be mounted on or attached to the second surface of the substrate. Moreover, the conductive bumps may be electrically connected to the conductor pattern, such as by any known reflow process, which also may mechanically affix the conductive bumps to the first surface of the substrate. Nevertheless, if the conductive bump contact areas are not substantially aligned with their corresponding conductive bump before the conductive bumps are disposed on the first surface of the substrate, a sufficient electrical connection between the conductive bumps and the conductive bump contact areas may not be achieved. Moreover, if the conductive bumps are of a non-uniform height, it may be more difficult to mount the conductive bumps to an external component, such as a motherboard of a computer, than if the conductive bumps were of a uniform height. Moreover, when the height of the conductive bumps are non-uniform, an electrical connection between the some of the conductive bumps and the external component may be weakened.

SUMMARY OF THE INVENTION

Therefore, a need has arisen for methods of manufacturing a ball grid array package which may overcome these and other shortcoming of the related art. A technical advantage of the present invention is that a conductive contact area of a substrate may be substantially aligned with a conductive bump before the conductive bump is disposed on the conductive contact area. Another technical advantage of the present invention is that the conductive bumps may have a substantially uniform height.

According to an embodiment of the present invention, a method for manufacturing a ball grid array semiconductor package is described. The method comprises the step of providing a substrate having a first surface and a second surface, in which the first surface or the second surface comprises a conductor pattern. The method also comprises the step of disposing a plurality of conductor bumps on the first surface of the substrate and attaching a semiconductor die to the second surface of the substrate. The method further comprises the step of electrically connecting the conductive bumps to the conductor pattern, such that electrically connecting the conductive bumps to the conductor pattern mechanically affixes the conductive bumps to the first surface of the substrate. The method also comprises the steps of mechanically testing the ball grid array semiconductor package to determine whether a height of the conductive bumps are substantially uniform, and planarizing the conductive bumps when the height of the conductive bumps are non-uniform.

According to another embodiment of the present invention, a method for manufacturing a ball grid array semiconductor package is described. The method comprises the step of providing a substrate having a first surface and a second surface, in which the first surface or the second surface comprises a conductor pattern. The method also comprises the steps of providing a plurality of conductive bump contact areas on the first surface of the substrate, and substantially aligning each of the conductive bump contact areas with at least one conductive bump. The method further comprises the step of disposing at least one of the conductor bumps on each of the conductive bump contact areas. Moreover, the step of substantially aligning the conductive bump contact areas with at least one of the conductive bumps comprises the step of vibrating at least a portion of the substrate, which substantially aligns each of the conductive bump contact areas with at least one of said conductive bumps. The method further comprises the step of electrically connecting the conductive bumps to the conductor pattern, such that electrically connecting the conductive bumps to the conductor pattern mechanically affixes the conductive bumps to the first surface of the substrate. The method also comprises the steps of mechanically testing the ball grid array semiconductor package to determine whether a height of the conductive bumps are substantially uniform, and planarizing the conductive bumps when the height of the conductive bumps are non-uniform.

According to yet another embodiment of the present invention, a planarizing apparatus is described. The planarizing apparatus comprises a planarizing surface and means, eg., a vacuum, for picking up a ball grid array semiconductor package comprising a plurality of conductive bumps affixed to a first surface of a substrate. Moreover, the means for picking up the ball grid array package contacts the conductive bumps with the planarizing surface with a predetermined amount of force.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and features and advantages thereof, reference now is made to the following descriptions taken in connection with the accompanying drawings.

FIG. 4 is a flow chart of a method of manufacturing a ball grid array according to an embodiment of the present invention.

FIG. 5 is a flow chart of a method of manufacturing a ball grid array according to an embodiment of the present invention.

DETAILED DESCRIPTION OF PREFERRED EMBODIMENTS

Preferred embodiments of the present invention and their advantages may be understood by referring to FIGS. 1–6, like numerals being used for like corresponding parts in the various drawings.

Figure 1:
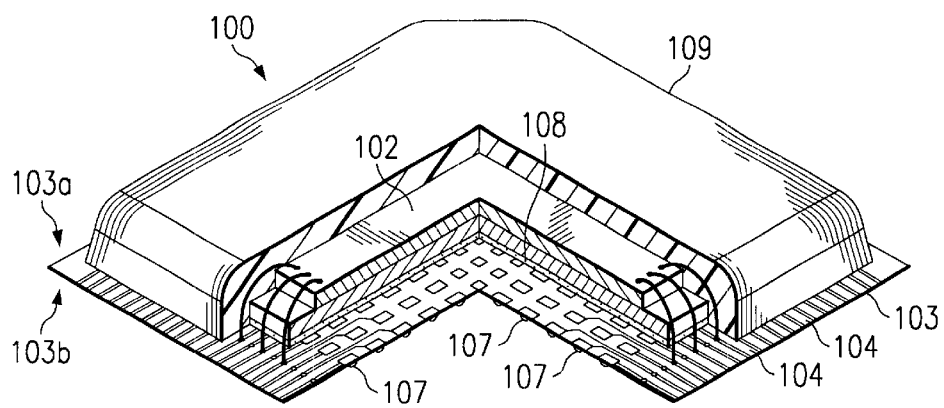
FIG. 1 is an exterior oblique view ball grid array semiconductor package according to an embodiment of the present invention.

Referring to FIG. 1, a ball grid array semiconductor package 100 is described. Ball grid array semiconductor package 100 may comprise a substrate 103, such as an insulating substrate. For example, substrate 103 may be a film manufactured from a straight-chain non-thermoplastic polymide. Moreover, substrate 103 may have a first surface 103b, which may be a bottom portion of substrate 103, and a second surface 103a, which may be a top portion of substrate 103. Ball grid array semiconductor package 100 also may comprise a plurality. of conductive bumps 107, which may be formed on conductive bump contact areas (not shown) formed on first surface 103b. Ball grid array semiconductor package 100 further may comprise a semiconductor die 102 mounted on or attached to second surface 103a, which may be sealed to substrate 103 by a molding resin 109. For example, semiconductor die 102 may be attached to second surface 103a by a die attaching material disposed on second surface 103a, such as an adhesive manufactured from a non-conductive epoxy resin, or the like.

In one embodiment, first surface 103b may comprise a conductor pattern 104, which may electrically connect semiconductor die 102 to conductive bumps 107 when conductive bumps 107 are electrically connected to conductor pattern 104 and mechanically affixed to first surface 103b by any known reflow process. For example, conductive 104 may be a copper pattern, and the copper pattern may be formed by bonding a copper foil on first surface 103b by means of an adhesive layer, followed by an etching away of the undesired portions of the copper foil. Alternatively, second surface 103a may comprise conductor pattern 104, which may be formed on second surface 103a by any of the above described methods for forming conductor pattern 104.

Figure 2A:
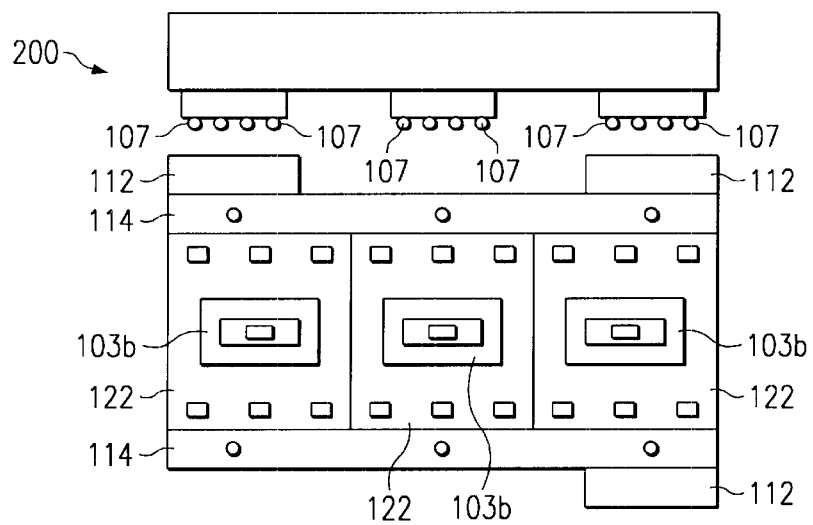
FIGS. 2a–2b are alignment apparatus for manufacturing a ball grid array package according to an embodiment of the present invention.
Figure 2B:
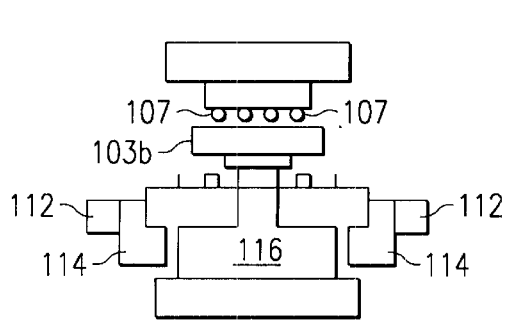

Referring to FIGS. 2a–2b, an alignment apparatus 200 for manufacturing a ball grid array semiconductor package, such as a ball grid array semiconductor package 100, is described. Alignment apparatus 200 may comprise pushing means, such as a plurality of pushers 114, which may be positioned on opposite sides of a film 122, which may comprise a plurality of substrates 103. For example, substrates 103 may be positioned on film 122 such that a distance between each substrate 103 may be substantially equal. Moreover, the pushing means may move film 122 is a predetermined direction. Alignment apparatus 200 further may comprise at least one means for vibrating substrate 103, such as at least one vibrator 112, which may contact at least a portion of the pushing means and also may be positioned adjacent to a first end of film 122. In one embodiment, vibrator 122 may be an ultrasonic vibrator. Alternatively, the means for vibrating substrate 103 may comprise a first vibrator 112, a second vibrator 112, and a third vibrator 112, which may be positioned adjacent to the first end of film 122, a second end of film 122, and a third end of film 122, respectively. In one embodiment, first vibrator 112, second vibrator 112, and third vibrator 112 each may be an ultrasonic vibrator. Alignment apparatus 200 further may comprise means for lifting film 122, such as at least one backup plate 116.

In operation, the pushing means may move film 122 and substrates 103 in the predetermined direction, such as towards a plurality of conductive bumps 107, which may be disposed above film 122. When substrates 103 are in an appropriate position relative to conductive bumps 107, the means for vibrating may vibrate film 122 and substrates 103. For example, when film 122 vibrates and the means for vibrating comprise first vibrator 112, second vibrator 112, and third vibrator 112 positioned adjacent to the first end of film 122, the second end of film 122, and the third end of film 122, respectively, film 122 may move in a direction towards a fourth end of film 122, i.e., the end of film 122 without a vibrator 122 positioned adjacent to the end. In this embodiment, moving film 122 in a single direction may allow the conductive bump contact areas (not shown) formed on first surface 103b of substrate 103 to substantially align with a corresponding conductive bump 107. When each of the conductive bump contact areas are substantially aligned with at least one conductive bump 107, the vibration of film 122 and substrates 103 may discontinue. The means for lifting film 122 then may lift film 122 towards conductive bumps 107 disposed above film 122, such that the conductive bump contact areas may contact the corresponding conductive bump 107, which may dispose each conductive bump 107 on the corresponding conductive bump contact area.

Figure 3:
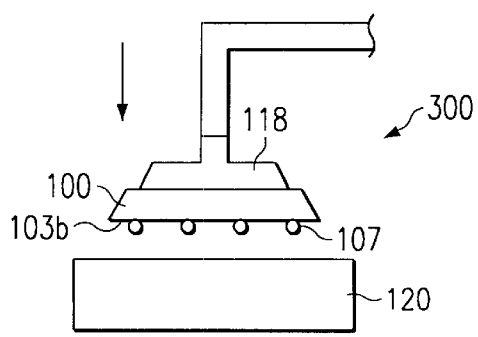
FIG. 3 is a planarizing apparatus for manufacturing a ball grid array package according to an embodiment of the present invention.

Referring to FIG. 3, a planarizing apparatus 300 is described. Planarizing apparatus 300 may comprise means for holding a ball grid array semiconductor package, such as a ball grid array semiconductor package 100. For example, the means for holding ball grid array semiconductor package 100 may be a vacuum 118. Planarizing apparatus 300 also include means for planarizing conductive bumps 107, which may be a planarizing surface 120. In operation, after conductive bumps 107 are disposed on the conductive bump contact areas formed on first surface 103b and are mechanically affixed to first surface 103b by any known reflow process, the means for holding ball grid array semiconductor package 100 may lower ball grid array semiconductor package 100 onto the means for planarizing conductive bumps 107, such that conductive bumps 107 may contact the means for planarizing conductive bumps 107 with a predetermined force. The predetermined force may be a force sufficient to decrease a height of any non-uniform conductive bumps 107, such that a height of each conductive bump 107 may be substantially uniform relative to the height of each of the other conductive bumps 107.

Referring to FIG. 4, a method 400 for manufacturing a ball grid array semiconductor package, such as a ball grid array semiconductor package 100 according to any of the described embodiments of the present invention, is described. In step 402, a substrate 103, having a first surface 103b and a second surface 103a, may be provided. In one embodiment, first surface 103b may comprise a conductor pattern 104. Alternatively, second surface 103a may comprise conductor pattern 104. In step 404, a plurality of conductive bump contact areas (not shown) may be provided on first surface 103b. In step 406, each of the conductive bump contact areas may be substantially aligned with at least one conductive bump 107 by vibrating at least a portion of substrate 103. For example, at least a portion of substrate 103 may be ultrasonically vibrated. In one embodiment, a first end, a second end, and a third end of a film 122 may be vibrated or ultrasonically vibrated, which may substantially align each of the conductive bump contact areas with at least one corresponding conductive bump 107. In each of the above described embodiments, when each of the conductive bump contact areas are substantially aligned with at least one conductive bump 107, the vibration of at least a portion of substrate 103 may be discontinued. Moreover, in step 408, at least one conductive bump 107 may be disposed on each of the conductive bump contact areas.

Referring to FIG. 5, a method 500 for manufacturing a ball grid array semiconductor package, such as a ball grid array semiconductor package 100 according to any of the described embodiments of the present invention, is described. In step 502, a substrate 103, having a first surface 103b and a second surface 103a, may be provided. In one embodiment, first surface 103b may comprise a conductor pattern 104. Alternatively, second surface 103a may comprise conductor pattern 104. In step 504, a plurality of conductive bumps 107 may be disposed on first surface 103b. In step 506, a semiconductor die 102 may be mounted on or attached to second surface 103a. In step 508, conductive bumps 107 may be electrically connected to conductor pattern 104, such as by any known reflow process, which also may mechanically affix conductive bumps 107 to first surface 103b. In step 510, ball grid array semiconductor package 100 may be mechanically tested, which may comprise determining whether a height of conductive bumps 107 are substantially uniform. In step 512, conductive bumps 107 may be planarized when the height of at least one conductive bump 107 is non-uniform relative to the height of at least one other conductive bump 107. For example, planarizing conductive bumps 107 may comprise the step of contacting conductive bumps 107 with a planarizing surface 120 with a predetermined amount of downward force. Moreover, the predetermined force may be a force sufficient to decrease a height of any non-uniform conductive bumps 107, such that a height of each conductive bump 107 may be substantially uniform relative to the height of each of the other conductive bumps 107.

Figure 6:
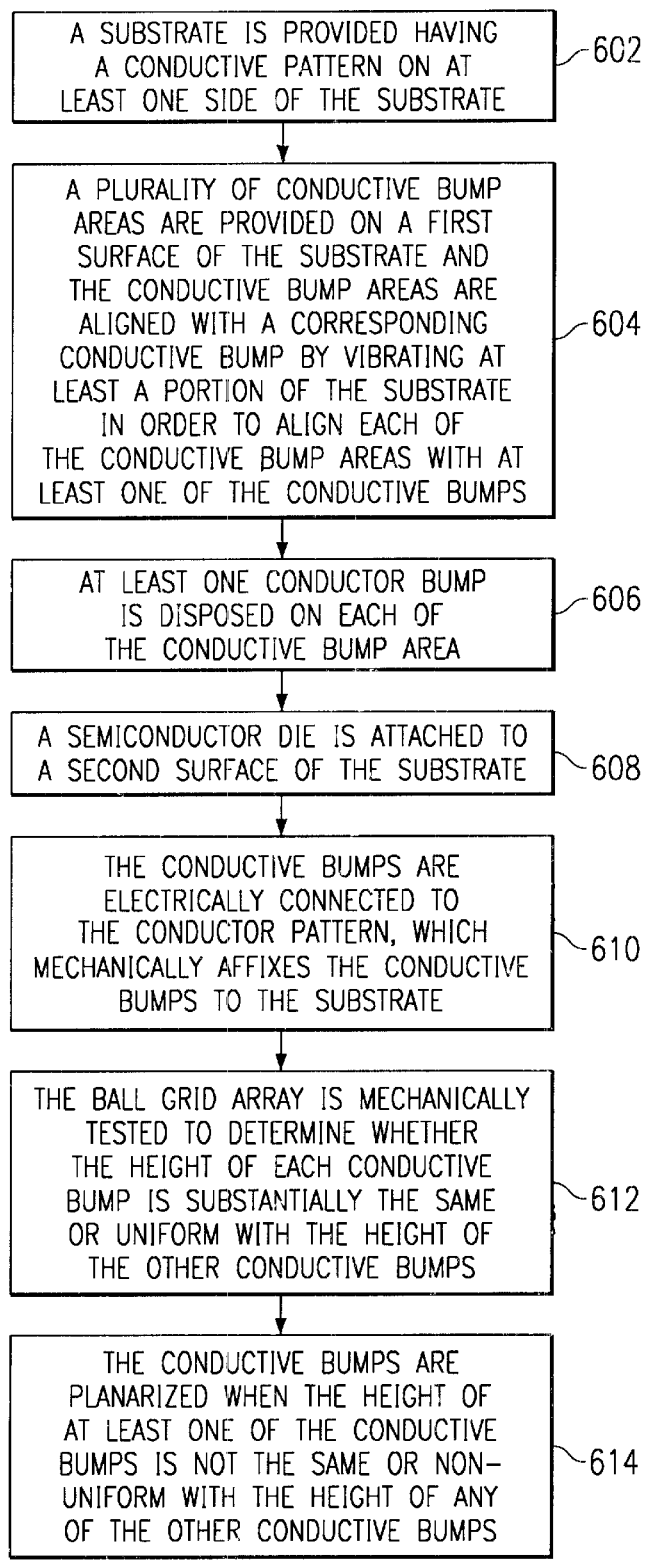
FIG. 6 is a flow chart of a method of manufacturing a ball grid array according to an embodiment of the present invention.

Referring to FIG. 6, a method 600 for manufacturing a ball grid array semiconductor package, such as a ball grid array semiconductor package 100 according to any of the described embodiments of the present invention, is described. In step 602, a substrate 103, having a first surface 103b and a second surface 103a, may be provided. In one embodiment, first surface 103b may comprise a conductor pattern 104. Alternatively, second surface 103a may comprise conductor pattern 104. In step 604, a plurality of conductive bump contact areas (not shown) may be provided on first surface 103b. Moreover, in step 604, each of the conductive bump contact areas may be substantially aligned with at least one conductive bump 107 by vibrating at least a portion of substrate 103. For example, at least a portion of substrate 103 may be ultrasonically vibrated. In one embodiment, a first end, a second end, and a third end of a film 122 may be vibrated or ultrasonically vibrated, which may substantially align each of the conductive bump contact areas with at least one corresponding conductive bump 107. In each of the above described embodiments, when each of the conductive bump contact areas are substantially aligned with at least one conductive bump 107, the vibration of at least a portion of substrate 103 may be discontinued. In step 606, at least one conductive bump 107 may be disposed on each of the conductive bump contact areas. In step 608, a semiconductor die 102 may be mounted on or attached to second surface 103a. In step 610, conductive bumps 107 may be electrically connected to conductor pattern 104, such as by any known reflow process, which also may mechanically affix conductive bumps 107 to first surface 103b. In step 612, ball grid array semiconductor package 100 may be mechanically tested, which may comprise determining whether a height of conductive bumps 107 are substantially uniform. In step 614, conductive bumps 107 may be planarized when the height of at least one conductive bump 107 is non-uniform relative to the height of at least one other conductive bump 107. For example, planarizing conductive bumps 107 may comprise the step of contacting conductive bumps 107 with a planarizing surface 120 with a predetermined amount of downward force. Moreover, the predetermined force may be a force sufficient to decrease a height of any non-uniform conductive bumps 107, such that a height of each conductive bump 107 may be substantially uniform relative to the height of each of the other conductive bumps 107.

While the invention has been described in connection with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein. It is intended that the specification and the described examples are considered exemplary only, with the true scope and spirit of the invention indicated by the following claims.

We claim:

1. A method of manufacturing a ball grid array semiconductor package comprising the steps of:

providing a substrate, wherein said substrate comprises a first surface and a second surface and said first surface or said second surface comprises a conductor pattern;

disposing a plurality of conductive bumps on said first surface of said substrate;

attaching a semiconductor die to said second surface of said substrate;

electrically connecting said conductive bumps to said conductor pattern, wherein electrically connecting said conductive bumps to said conductor pattern mechanically affixes said conductive bumps to said first surface of said substrate;

mechanically testing said ball grid array semiconductor package, wherein the step of mechanically testing said ball grid array semiconductor package comprises the step of determining whether a height of said conductive bumps is substantially uniform; and planarizing said conductive bumps when the height of at least one of said conductive bumps is non-uniform relative to the height of at least one other of said conductive bumps.

2. The method of claim 1, wherein the step of planarizing said conductive bumps comprises the step of contacting said conductive bumps with a planarizing surface.

3. The method of claim 2, wherein the step of contacting comprises the step of contacting said conductive bumps with said planarizing surface with a predetermined amount of force, wherein contacting with said predetermined amount of force decreases the height of at least one of said conductive bumps, such that the height of said conductive bumps is substantially uniform.

4. The method of claim 3, wherein said conductive bump comprises solder.

5. The method of claim 1, wherein the step of electrically connecting said conductive bumps to said conductor pattern comprises the step of melting said conductive bumps by a reflow process.

6. A method of manufacturing a ball grid array semiconductor package comprising the steps of:

providing a substrate, wherein said substrate comprises a first surface and a second surface and said first surface or said second surface comprises a conductor pattern;

providing a plurality of conductive bump contact areas on said first surface of said substrate;

substantially aligning each of said conductive bump contact areas with at least one conductive bump, wherein the step of substantially aligning said conductive bump contact areas with at least one of said conductive bumps comprises the step of vibrating at least a portion of said substrate, wherein said vibration of at least a portion of said substrate substantially aligns each of said conductive bump contact areas with at least one of said conductive bumps;

disposing at least one conductor bump on each of said conductive bump contact areas;

attaching a semiconductor die to said second surface of said substrate;

electrically connecting said conductive bumps to said conductor pattern, wherein electrically connecting said conductive bumps to said conductor pattern mechanically affixes said conductive bumps to said first surface of said substrate;

mechanically testing said ball grid array semiconductor package, wherein the step of mechanically testing said ball grid array semiconductor package comprises the step of determining whether a height of said conductive bumps is substantially uniform; and planarizing said conductive bumps when the height of at least one of said conductive bumps is non-uniform relative to the height of at least one other of said conductive bumps.

7. The method of claim 6, wherein the step of vibrating at least a portion of said substrate comprises the step of ultrasonically vibrating at least a portion of said substrate.

8. The method of claim 7, further comprising the step of discontinuing said ultrasonic vibration of at least a portion of said substrate when each of said conductive bump contact areas are substantially aligned with at least one of said conductive bumps.

9. The method of claim 6, wherein the step of planarizing said conductive bumps comprises the step of contacting said conductive bumps with a planarizing surface.

10. The method of claim 7, wherein the step of contacting comprises the step of contacting said conductive bumps with said planarizing surface with a predetermined amount of force, wherein contacting with said predetermined amount of force decreases the height of at least one of said conductive bumps, such that the height of said conductive bumps is substantially uniform.

11. The method of claim 6, wherein the step of electrically connecting said conductive bumps to said conductor pattern comprises the step of melting said conductive bumps by a reflow process.

* * * * *